US011522555B1

(12) United States Patent
Ge et al.

(10) Patent No.: US 11,522,555 B1
(45) Date of Patent: Dec. 6, 2022

(54) MULTISTAGE ANALOG-TO-DIGITAL CONVERTERS FOR CROSSBAR-BASED CIRCUITS

(71) Applicant: TetraMem Inc., Newark, CA (US)

(72) Inventors: Ning Ge, Newark, CA (US); Wenbo Yin, Alameda, CA (US)

(73) Assignee: TetraMem Inc., Fremont, CA (US)

( * ) Notice: Subject to any disclaimer, the term of this patent is extended or adjusted under 35 U.S.C. 154(b) by 0 days.

(21) Appl. No.: 17/347,516

(22) Filed: Jun. 14, 2021

(51) Int. Cl.
*H03M 1/12* (2006.01)
*H03M 1/46* (2006.01)
*H03M 1/36* (2006.01)
H03M 1/10 (2006.01)
H03M 1/00 (2006.01)

(52) U.S. Cl.
CPC ........... *H03M 1/468* (2013.01); *H03M 1/361* (2013.01); *H03M 1/00* (2013.01); *H03M 1/1009* (2013.01); *H03M 1/12* (2013.01)

(58) Field of Classification Search
CPC ........ H03M 1/468; H03M 1/361; H03M 1/12; H03M 1/00; H03M 1/1009
See application file for complete search history.

(56) References Cited

U.S. PATENT DOCUMENTS 9,746,832 B1 * 8/2017 Yao .................. H03M 1/50

OTHER PUBLICATIONS

PCT Search Report and Written Opinion for PCT/US2022/033450, dated Jul. 26, 2022, 6 pages.

\* cited by examiner

*Primary Examiner* — Joseph J Lauture
(74) *Attorney, Agent, or Firm* — Jaffery Watson Mendonsa & Hamilton LLP

(57) ABSTRACT

In accordance with some embodiments of the present disclosure, an apparatus including a crossbar circuit is provided. The crossbar circuit may include a plurality of cross-point devices with programmable conductance, a transimpedance amplifier (TIA), and an analog-to-digital converter (ADC). The TIA is configured to produce an output voltage based on an input current corresponding to a summation of current from a first plurality of the cross-point devices. The ADC is configured to generate a digital output corresponding to a digital representation of the output voltage of the TIA. To generate the digital output, the ADC is to generate, using a comparator, a first plurality of bits (e.g., MSBs) of the digital output by performing a coarse conversion process and a second plurality of bits (e.g., LSBs) of the digital output by performing a fine conversion process on a sample-and-hold voltage produced in the coarse conversion process.

20 Claims, 9 Drawing Sheets

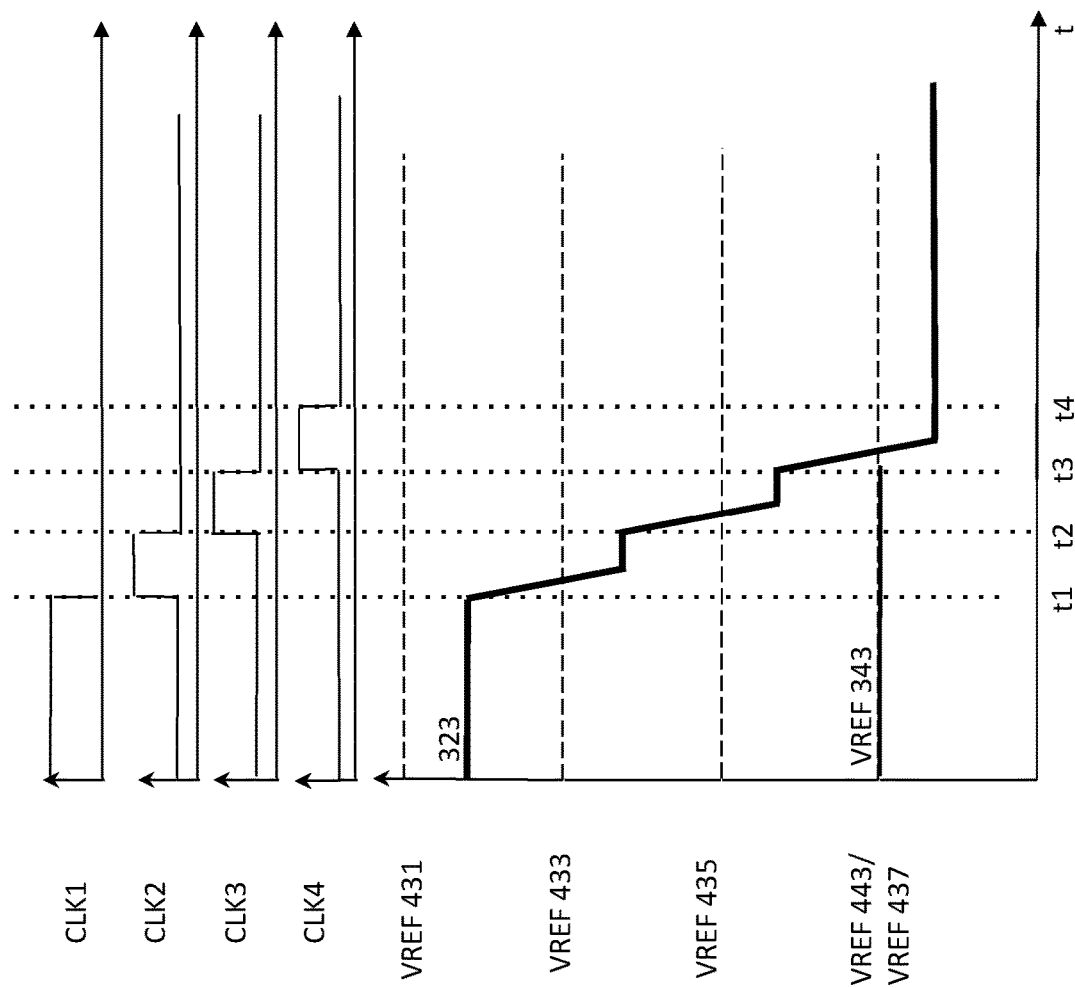

MULTISTAGE ANALOG-TO-DIGITAL CONVERTERS FOR CROSSBAR-BASED CIRCUITS

TECHNICAL FIELD

The implementations of the disclosure relate generally to semiconductor devices and, more specifically, to multistage analog-to-digital converters for crossbar-based circuits.

BACKGROUND

A crossbar circuit may refer to a circuit structure with interconnecting electrically conductive lines sandwiching a memory element, such as a resistive switching material, at their intersections. The resistive switching material may include, for example, a memristor (also referred to as resistive random-access memory (RRAM or ReRAM)). Crossbar circuits may be used to implement in-memory computing applications, non-volatile solid-state memory, image processing applications, neural networks, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, an apparatus is provided. The apparatus includes a plurality of cross-point devices with programmable conductance. The apparatus also includes a transimpedance amplifier (TIA) configured to produce an output voltage based on an input current, where the input current corresponds to a summation of current from a first plurality of the cross-point devices. The apparatus further includes an analog-to-digital converter (ADC) configured to generate a digital output corresponding to a digital representation of the output voltage of the TIA. In some embodiments, to generate the digital output, the ADC is to: generate, using a comparator, a first plurality of bits of the digital output by performing a coarse conversion process, where performing the coarse conversion process may include generating a sample-and-hold voltage based on the output voltage of the TIA; and generate, using the comparator, a second plurality of bits of the digital output by performing a fine conversion process on the sample-and-hold voltage.

In some embodiments, the first plurality of bits may include the most significant bit (MSB) of the digital output. The second plurality of bits may include the least significant bit (LSB) of the digital output. The plurality of cross-point devices may include at least one of a resistive random-access memory device, a phase-change memory (PCM) device, a floating gate device, a spintronic device, a magnetic memory storage (MRAM), a static random-access memory (SRAM) device, or a dynamic random-access memory (DRAM) device. The plurality of cross-point devices may include an array of cross-point devices. The first plurality of the cross-point devices may correspond to a column of the array of cross-point devices.

In some embodiments, performing the coarse conversion process may include: sampling an analog input voltage onto a first capacitor during a first coarse conversion period; comparing, using the comparator, the sampled analog input voltage with a comparator reference voltage at a first time instant corresponding to the end of the first coarse conversion period; and generating, using the comparator, a first comparator output based on the comparison. A bottom plate of the first capacitor is connected to a first reference voltage during the first coarse conversion period. The analog input voltage corresponds to the output voltage produced by the TIA.

To generate the sample-and-hold voltage, the ADC is further to: in view of the first comparator output indicating that the sampled analog input voltage is greater than the comparator reference voltage at the first time instant, downshift the sampled analog input voltage by switching the bottom plate of the first capacitor to a second reference voltage during a second conversion period.

In some embodiments, a difference between the first reference voltage and the second reference voltage is at least ¼ of a full-scale analog input level of the ADC.

To generate the sample-and-hold voltage, the ADC is further to: in view of the first comparator output indicating that the sampled analog input voltage is not greater than the comparator reference voltage at the first time instant, hold, using the first capacitor, the sample-and-hold voltage during one or more subsequent conversion periods.

In some embodiments, the apparatus may include a second capacitor configured to produce the comparator reference voltage during the fine conversion process.

In some embodiments, to perform the fine conversion process, the ADC is further to: compare, using the comparator, a ramped comparator reference voltage and the sample-and-hold voltage.

In some embodiments, to perform the fine conversion process, the ADC is further to: generate the second plurality of bits of the digital output based on an output of a counter.

According to one or more aspects of the present disclosure, a method is provided. The method may include generating, by an analog-to-digital converter (ADC) of a crossbar circuit, a digital output corresponding to a digital representation of an output voltage of a transimpedance amplifier (TIA) of the crossbar circuit, which may further include: generating, using a comparator, a first plurality of bits of the digital output by performing a coarse conversion process, where performing the coarse conversion may include generating a sample-and-hold voltage based on the output voltage of the TIA.

The method further includes generating, using the comparator, a second plurality of bits of the digital output by performing a fine conversion process on the sample-and-hold voltage, where the output voltage is produced by the TIA based on an input current corresponding to a summation of current from a plurality of cross-point devices of the crossbar circuit.

In some embodiments, the first plurality of bits may include the most significant bit (MSB) of the digital output, where the second plurality of bits may include the least significant bit (LSB) of the digital output. Performing the coarse conversion process may include: sampling an analog input voltage onto a first capacitor during a coarse conversion period, where a bottom plate of the first capacitor is connected to a first reference voltage during the first coarse conversion period, where the analog input voltage corresponds to the output voltage produced by the TIA; comparing, using the comparator, the sampled analog input voltage with a comparator reference voltage at a first time instant corresponding to the end of the first coarse conversion period; and generating, using the comparator, a first comparator output based on the comparison.

In some embodiments, generating the sample-and-hold voltage may include: in view of the first comparator output indicating that the sampled analog input voltage is greater than the comparator reference voltage at the first time instant, downshifting the sampled analog input voltage by switching the bottom plate of the first capacitor to a second reference voltage during a second conversion period.

In some embodiments, a difference between the first reference voltage and the second reference voltage is at least ¼ of a full-scale analog input level of the ADC.

In some embodiments, generating the sample-and-hold voltage may include: in view of the first comparator output indicating that the sampled analog input voltage is not greater than the comparator reference voltage at the first time instant, holding, using the first capacitor, the sample-and-hold voltage during one or more subsequent conversion periods.

The method may further include producing the comparator reference voltage during the fine conversion process using a second capacitor.

In some embodiments, performing the fine conversion process may include comparing, using the comparator, a ramped comparator reference voltage and the sample-and-hold voltage.

In some embodiments, performing the fine conversion process may further include generating the second plurality of bits of the digital output based on an output of a counter.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

FIGS. 4A, 4B, and 4C depict example waveforms relating to a coarse analog-to-digital conversion process in accordance with some embodiments of the present disclosure.

DETAILED DESCRIPTION

Figure 1:
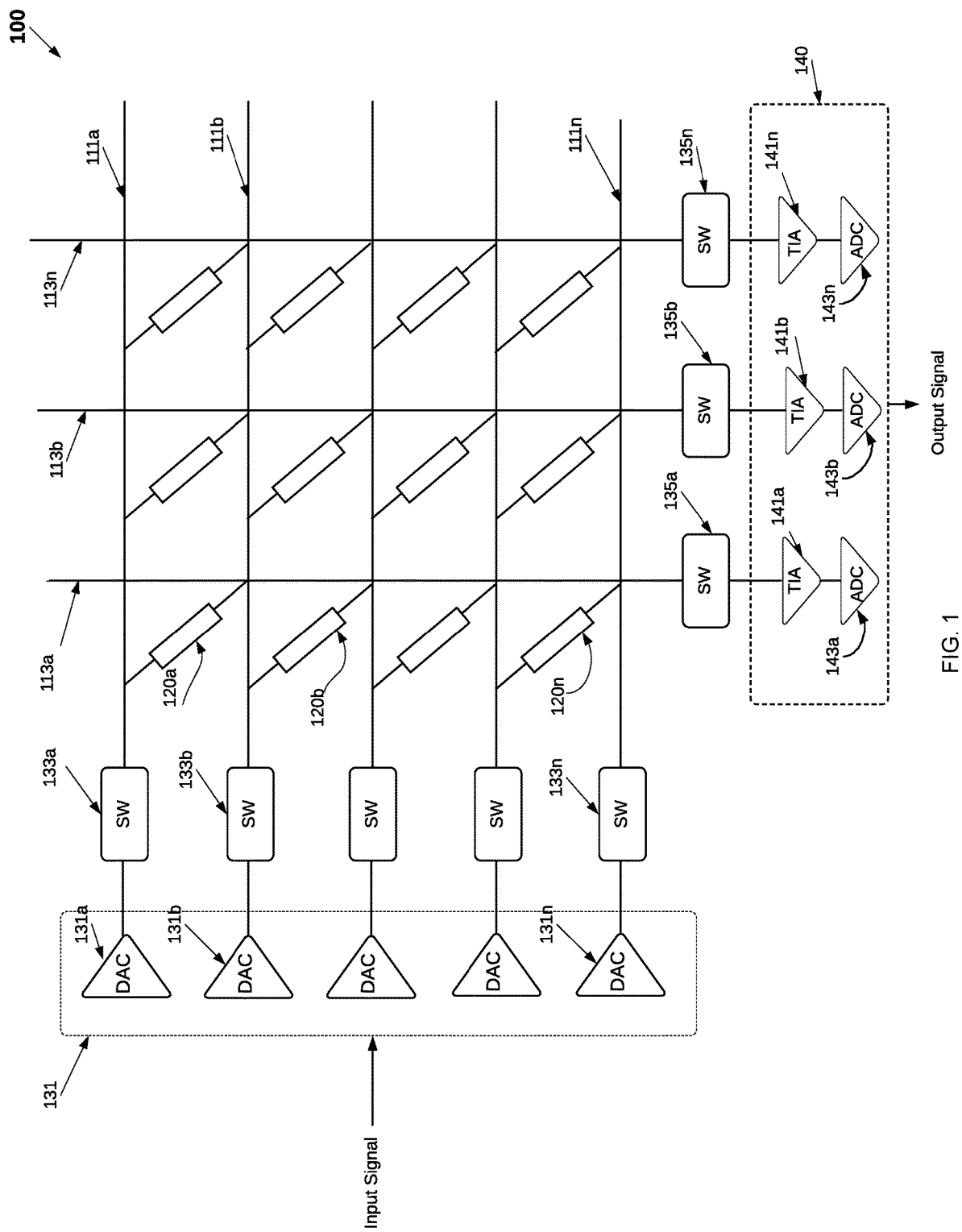
FIG. 1 is a schematic diagram illustrating an example of a crossbar circuit in accordance with some implementations of the present disclosure.

A crossbar circuit may include a plurality of interconnecting electrically conductive wires (e.g., metal wires) and cross-point devices formed at each row-column intersection. Each of the cross-point devices may be a device with programmable resistance, such as a memristor (also referred to as resistive random-access memory (RRAM or ReRAM)), phase-change memory (PCM) devices, floating gates, spintronic devices, static random-access memory (SRAM), etc. An apparatus (e.g., a chip or a computing device including multiple chips) including one or more crossbar circuits may be referred to as a crossbar-based apparatus. The crossbar-based apparatus may be used to implement in-memory computing applications.

The crossbar-based apparatus may further include other analog components, such as one or more digital-to-analog converters (DACs), analog-to-digital converters (ADCs), transimpedance amplifiers (TIAs), transistors, etc. for providing desirable outputs. For example, an ADC may be used to convert an analog output of a TIA of a channel of the crossbar-based apparatus (e.g., a column of the crossbar-based apparatus) into a digital signal. Different types of ADC architectures with different merits and trade-offs may be utilized to implement the crossbar-based apparatus. For example, an 8-bits Flash ADC may have to utilize 255 comparators to produce an 8-bit digital output. Implementing a crossbar-based apparatus utilizing FLASH ADCs may require 255 comparators for each channel of the crossbar-based apparatus, which may be impractical due to its requirements of a huge chip area and very high-power consumption.

The present disclosure provides analog-to-digital converter (ADC) architectures for crossbar-based apparatuses that provide optimized metrics in terms of die size, power consumption, performance, and accuracy.

A crossbar-based apparatus in accordance with the present disclosure may include an ADC that may convert an analog input voltage into a digital output. The analog input voltage may be an output voltage of a TIA of the crossbar-based apparatus. The TIA may convert a channel current signal into the output voltage. The channel current signal may represent the summation of current from a column of cross-point devices of the crossbar-based apparatus.

The ADC may convert the analog input voltage into the digital output by performing multiple stages of conversions. For example, the ADC may perform a coarse conversion to generate a first plurality of bits of the digital output. The ADC may then perform a fine conversion to generate a second plurality of bits of the digital output. The first plurality of bits may include the most significant bits (MSB) of the digital output. The second plurality of bits may include the least significant bit (LSB) of the digital output. The coarse conversion and the fine coarse conversion may be performed utilizing the same comparator in some embodiments.

During the coarse conversion process, the ADC may sample and hold the analog input in a first coarse conversion period (e.g., a sampling phase). A comparator may compare the sample-and-hold voltage with a comparator reference voltage at the end of the first coarse conversion period. The comparator reference voltage may represent ¼ of the full-scale analog input level of the ADC. As used herein, the full-scale analog input level of the ADC may refer to the largest signal amplitude that can be delivered to the ADC before the signal is clipped into it is digital output representation. The comparator may generate an output indicating whether the sample-and-hold voltage is greater than the comparator reference voltage at the end of the first coarse conversion period (also referred to as the "first output"). For example, a first value of the output (e.g., "1") may indicate that the sample-and-hold voltage is greater than the comparator reference voltage at the end of the first coarse conversion period. A second value of the output (e.g., "0") may indicate that the sample-and-hold voltage is not greater than the comparator reference voltage at the end of the first coarse conversion period. The first output may be stored for generating the first plurality of bits of the digital output.

If the sample-and-hold voltage is not greater than the comparator reference voltage at the end of the first coarse conversion period, the ADC may hold the sample-and-hold voltage through the remaining coarse conversion periods and may skip the rest of the coarse conversion process. Alternatively, the ADC may downshift the sample-and-hold voltage in one or more subsequent coarse conversion periods until the output of the comparator indicates that the sample-and-hold voltage is not greater than the comparator reference voltage. For example, the ADC may downshift the sample-and-hold voltage in a second coarse conversion period in some embodiments in which the second output of the comparator indicating that the sample-and-hold voltage is greater than the comparator reference voltage at the end of the coarse conversion period. The comparator may generate a second output indicating whether the downshifted sample-and-hold voltage is greater than the comparator reference voltage at the end of the second coarse conversion period. If the sample-and-hold voltage is not greater than the comparator reference voltage at the end of the second coarse conversion period, the ADC may hold the sample-and-hold voltage through the remaining coarse conversion periods and may skip the rest of the coarse conversion process. Alternatively, the ADC may further downshift the sample-and-hold voltage in one or more subsequent coarse conversion periods until the sample-and-hold voltage is not greater than the comparator reference voltage. The values of the first output, the second output, and/or the other output of the comparator in the coarse conversion process may be converted into the MSB bits of the digital output of the ADC.

In the fine conversion process, the ADC may generate a ramp voltage that ramps down the comparator reference voltage through capacitive coupling. The comparator may compare the ramped comparator reference voltage and the sample-and-hold voltage produced by the ADC in the coarse conversion process. The comparator may generate an output indicating that the sample-and-hold voltage and the ramp comparator reference voltage have the same value at a certain time instant in the fine conversion process. The ADC may then stop the counter once the ramped comparator reference voltage is less than the sample-and-hold voltage. A counter may count the number of clock cycles corresponding to the time instant. The maximum clock count for ramp ADC counter to ramp the entire quadrant (¼ of the full-scale input range) is $2^M$. M represents the number of the LSB digits. The ADC may then generate the second plurality of bits based on the number of the clock cycles.

More particularly, for example, to convert the analog input voltage into an 8-bit digital output, the ADC may perform a coarse conversion process to produce 2-bit MSB digits and a second conversion process to produce 6-bit LSB digits. In the coarse conversion process, the ADC may sample the analog input voltage and may successively downshift the sampled analog input voltage into the quadrant (¼ of the full-scale analog input level) through three successive comparisons between the sample-and-hold voltage and the comparator reference voltage and/or downshifting. The coarse conversion process may thus produce the first 2 MSB digits of the digital output and position the sample-and-hold voltage into the quadrant for fine conversion. During the fine conversion process, the comparator may compare the sample-and-hold voltage with the ramped comparator reference voltage and may generate an output indicating that the sample-and-hold voltage is the same as the ramped comparator reference voltage a certain time instant. The counter may generate an output indicative of the number of clock cycles that has elapsed since the beginning of the fine conversion process. The number of clock cycles may be converted into the 6-bit LSB digits of the digital output.

By performing the coarse conversion process and the fine conversion process using digital circuits in majority, the ADC disclosed herein may enable high accuracy, high throughput, lower-power-consumption applications utilizing crossbar circuits. The ADC may generate an 8-bit resolution digital output by performing the first coarse conversion process in at four coarse conversion periods and performing the second conversion process in 64 clock cycles. Each coarse conversion period may include a clock cycle that may be divided from a base clock (e.g., divided by 8 depending on accuracy requirement in coarse conversion). It may take 68 clocks to get an 8-bit digital output. As such, the ADC according to the present disclosure is faster than a ramp ADC that may require 256 clock cycles to generate an 8-bit output. Moreover, if the resolution required is increased, the clock count for a ramp ADC may increase exponentially. By contrast, the clock count required by the ADC architecture disclosed herein may increase slightly for implementing an ADC of higher resolutions (linearly with resolution required). Furthermore, multiple multistage ADCs in a crossbar circuit may share certain control circuitry (e.g., reference voltages, counters, etc.), which may further enhance the performance of the crossbar circuit. Accordingly, the present disclosure provides for ADCs that may enable small die size in-memory computing applications that require high speed, high accuracy, and low power analog-to-digital conversion.

FIG. 1 is a diagram illustrating an example 100 of a crossbar circuit in accordance some embodiments of the present disclosure. As shown, crossbar circuit 100 may include one or more row wires 111 a-n, column wires 113 a-n, cross-point devices 120a-n, digital to analog converters (DACs) 131a-n, row switches 133a-n, column switches 135a-n, output sensors 140, and/or any other suitable component for implementing a crossbar circuit.

Row wires 111 may include a first row wire 111a, a second row wire 111b, . . . , a row wire 111n, etc. Each of row wires 111a-n may be and/or include any suitable electrically conductive material. In some embodiments, each row wire 111a-n may be a metal wire. Row wires may include a first row wire 111a, a second row wire 111b, . . . , row wire 111n. Each of row wires 111a-n may be and/or include a metal wire.

Column wires 113 may include a first column wire 113a, a second column wire 113b, . . . , column wire 113n. Each of column wires 113a-n may be and/or include any suitable electrically conductive material. In some embodiments, each column wire 113a-n may be a metal wire. Column wires may include a first column wire 113a, a second column wire 113b, . . . , column wire 113n. Each of column wires 113a-n may be and/or include a metal wire.

As illustrated in FIG. 1, row wires 111a-n and column wires 113 a-n may intersect with each other. Cross-point devices 120a-n may connect intersections between row wires 111a-n and column wires 113a-n. For example, a first cross-point device 120a may connect a first row wire 111a and a first column wire 113a. As another example, a second cross-point device 120b may connect the first row wire 111a and a second column wire 113b. Each cross-point device 120 may be and/or include a select transistor, and any suitable device with tunable resistance, such as a memristor, a PCM device, a floating-gate device, a spintronic device, a magnetic memory storage (MRAM), an RRAM, an SRAM, etc. The cross-point devices 120 may form an array as illustrated in FIG. 1.

Each DAC 131*a-n* may convert an input digital signal into an output analog signal. In some embodiments, each DAC 131 may include an op-amp. In some embodiments, DAC 131 may be connected to an op-amp for converting a digital input signal into an analog output signal.

Each of row wires 111*a-n* may be connected to one or more row switches 133*a*, 133*b*, . . . , 133*n*. Each row switches 133*a-n* may include any suitable circuit structure that may control current flowing through row wires 111*a-n*. For example, row switches 133*a-n* may be and/or include a CMOS switch circuit.

Each of column wires 113*a-n* may be connected to one or more column switches 135*a*, 135*b*, . . . , 135*n*. Each column switches 135*a-n* may include any suitable circuit structure that may control current passed through column wires 113*a-n*. For example, column switches 135*a-n* may be and/or include a CMOS switch circuit. In some embodiments, one or more of switches 131*a-n* and 135*a-n* may further provide fault protection, electrostatic discharge (ESD) protection, noise reduction, and/or any other suitable function for one or more portions of crossbar circuit 100.

Output sensor(s) 140 may generate an output signal in view of current flowing through column wires 113*a-n*. Output sensor(s) 140 may include any suitable component for converting the current into the output signal, such as one or more TIAs 141*a*, 141*b*, . . . , 141*n*, and ADCs 143*a*, 143*b*, . . . , 143*n*. Each TIAs 141*a-n* may convert the current through a respective column wire into a respective voltage signal. Each ADCs 143*a-n* may convert the voltage signal produced by its corresponding TIA into a digital output. Each ADCs 143*a-n* may include one or more components as described in connection with FIGS. 2-3 below. In some embodiments, output sensor(s) 140 may further include one or more multiplexers (not shown).

Crossbar circuit 100 may perform parallel weighted current summation. For example, an input signal may be applied to one or more rows of crossbar circuit 100 (e.g., one or more selected rows). The input signal may flow through the cross-point devices of the rows of the crossbar circuit 100. An output signal may be read from the columns (e.g., outputs of the ADCs). According to Ohm's law and Kirchhoff's current law, the input-output relationship of the crossbar can be represented as I=VG, wherein I represents the output signal; V represents the input; and G represents conductance of the cross-point devices. As such, the input signal is weighted at each of the cross-point devices by its conductance according to Ohm's law. The weighted current is outputted via each column wire and may be accumulated according to Kirchhoff's current law.

Figure 2:
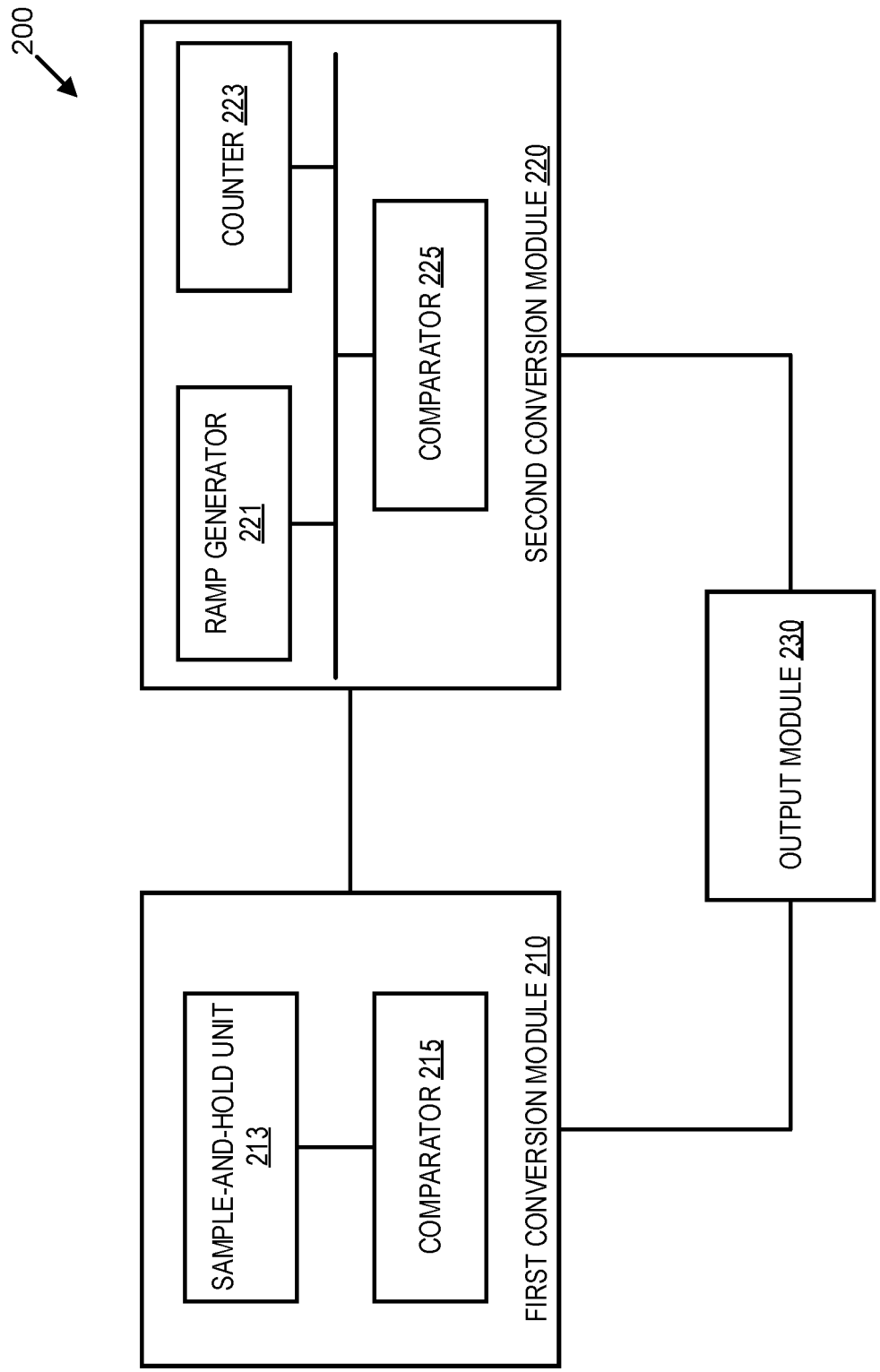
FIG. 2 is a block diagram illustrating a multistage analog-to-digital converter in accordance with some implementations of the present disclosure.

FIG. 2 is a block diagram illustrating an example 200 of a multistage ADC in accordance with some embodiments of the present disclosure. As shown, ADC 200 may include a first conversion module 210, a second conversion module 220, and an output module 230. The first conversion module 210 may further include a sample-and-hold unit 213 and a comparator 215. The second conversion module 220 may further include a ramp generator 221, a counter 223, and a comparator 225. More or fewer components may be included in ADC 200 without loss of generality. For example, two of the modules may be combined into a single module, or one of the modules may be divided into two or more modules. In some embodiments, the comparator 215 may be the same as the comparator 225. In some embodiments, the sample-and-hold unit 213 may include the capacitor 303, switches 301 and 307*a-d*, etc. of FIG. 3. In some embodiments, the comparator 215 may be and/or include the comparator 305 of FIG. 3. In some embodiments, the second conversion module 220 may include the comparator 305, the counter 315, the ramp generator 311, etc. of FIG. 3.

The ADC 200 may convert an analog input voltage into a digital output. The analog input voltage may be an output voltage produced by a TIA of a crossbar circuit (e.g., TIA 141*a* as described in connection with FIG. 1). The digital output may include a plurality of bits and may be regarded as being a digital representation of the output voltage produce by the TIA.

To convert the analog input voltage into the digital output, the first conversion module 210 may perform a coarse conversion process during one or more coarse conversion periods to produce one or more first bits of the digital output. The first bits may include, for example, the most significant bit (MSB) of the digital output. Each of the coarse conversion periods may include one or more clock cycles. In some embodiments, each of the coarse conversion periods may correspond to a respective conversion clock cycle. The number of the first conversion clock periods may be determined based on the number of first bits to be generated during the coarse conversion process. For example, the coarse conversion process may be performed in four coarse conversion periods to generate a 2-bit coarse conversion result.

During the coarse conversion process, the sample-and-hold unit 213 may sample and hold the analog input voltage and may produce a sample-and-hold voltage. For example, the sample-and-hold unit 213 may sample the analog input referencing to a first coarse reference voltage in a first coarse conversion period (e.g., by sampling and holding the analog input voltage onto a sampling capacitor with respect to the first coarse reference voltage). The first coarse reference voltage may represent the full-scale analog input level of the ADC. The comparator 215 may compare the sample-and-hold voltage with a comparator reference voltage and generate a first output indicative of the comparison result. The comparator reference voltage may represent ¼ of the full-scale analog input level. The first output of the comparator 215 may indicate whether the sample-and-hold voltage is greater than the comparator reference voltage at the end of the first coarse conversion period. The comparator 215 may also latch the first output to generate the first bits of the digital output.

The sample-and-hold voltage may be further processed based on the first output of the comparator. For example, in some embodiments in which the sample-and-hold voltage is not greater than the comparator reference voltage at the end of the first coarse conversion period, the sample-and-hold unit 213 may hold the value of the sample-and-hold voltage through the remaining coarse conversion process. For example, the coarse conversion process may be performed in four clock cycles to generate a 2-bit coarse conversion result. The sampled-and-help voltage may be held through a second coarse conversion period, a third coarse conversion period, and a fourth coarse conversion period in view of the first output of the comparator indicating that the sample-and-hold voltage is less than the comparator reference voltage at the end of the first coarse conversion period.

If the first output of the comparator 215 indicates that the sample-and-hold voltage is greater than the comparator reference voltage at the end of the first coarse conversion period, the sample-and-hold unit 213 may downshift the sample-and-hold voltage in one or more subsequent coarse conversion periods until an output of the comparator 215 indicates that the sample-and-hold voltage is not greater than the comparator reference voltage. For example, the sample-and-hold unit 213 may downshift the sample-and-hold voltage referring to a second coarse reference voltage in the second coarse conversion period (e.g., by switching the bottom plate of the sampling capacitor from the first reference voltage to the second reference voltage). The amplitude of the second coarse reference voltage may be ¾ of the full-scale analog input level. The comparator 215 may compare the sample-and-hold voltage with the comparator reference voltage and may generate a second output indicative of the comparison result. The second output of the comparator 215 may indicate whether the sample-and-hold voltage is greater than the comparator reference voltage at the end of the second coarse conversion period. The comparator 215 may also latch the second output to generate the first plurality of bits of the digital output.

The sample-and-hold voltage may be further processed based on the second output of the comparator 215. For example, in some embodiments in which the sample-and-hold voltage is not greater than the comparator reference voltage at the end of the second coarse conversion period, the sample-and-hold unit 213 may hold the value of the sample-and-hold voltage through the remaining coarse conversion process (e.g., through the third coarse conversion period and the fourth coarse conversion period to produce a 2-bit coarse conversion result).

In some embodiments in which the sample-and-hold voltage is greater than the comparator reference voltage at the end of the second coarse conversion period, the sample-and-hold unit 213 may further downshift the sample-and-hold input voltage in one or more subsequent coarse conversion periods. For example, the sample-and-hold unit 213 may downshift the sample-and-hold voltage by ¼ of the full-scale analog input level in the third coarse conversion period. The sample-and-hold voltage may be further downshifted, for example, by switching the bottom plate of the sampling capacitor to a third coarse reference voltage. The amplitude of the third coarse reference voltage may represent a half (½) of the full-scale analog input level. The comparator 215 may compare the comparator reference voltage with the sample-and-hold voltage at the end of the third coarse conversion period and may generate a third output indicative of the comparison result. The comparator 215 may also latch the third output to generate the first plurality of bits of the digital output.

The sample-and-hold voltage may be further processed based on the third output of the comparator. For example, the sample-and-hold unit 213 may hold the value of the sample-and-hold voltage through the coarse conversion process if the third output of the comparator 215 indicates that the sample-and-hold voltage is not greater than the comparator reference voltage at the end of the third coarse conversion period. Alternatively, the sample-and-hold unit 213 may further downshift the sample-and-hold voltage in one or more subsequent coarse conversion periods (e.g., the fourth coarse conversion period, etc.) until an output of the comparator 215 indicates that the sample-and-hold voltage is not greater than the comparator reference voltage.

The second conversion module 220 may perform a fine conversion process to generate one or more second bits of the digital output. The second bits of the digital output may include the least significant bit (LSB) of the digital output. For example, the ramp generator 221 may generate a ramp voltage that ramps down over time (e.g., by ramping down the comparator reference voltage proportionally through a coupling capacitor). The comparator 225 may compare the comparator reference voltage and the sample-and-hold voltage produced by the first conversion module 210 in the coarse conversion process. The comparator 225 may generate an output indicating that the comparator reference voltage has been ramped below the sample-and-hold analog input voltage at a certain time instant. The counter 223 may generate an output indicative of the number of clock cycles that has elapsed since the beginning of the fine conversion process until the sample-and-hold analog input voltage crosses the reference voltage. In some embodiments, the maximum ramp range of the ramp generator may be ¼ of the full-scale input range. The maximum clock count for the ramp ADC counter to ramp the entire quadrant (¼ of the full-scale input range) is $2^M$. M represents the number of the LSB digits.

The output module 230 may generate and/or output the digital output based on the first bits and the second bits. The output module 230 may include one or more registers, encoders, and/or any other suitable component for storing, processing, and/or outputting the digital output. The digital output may include a combination of the first bits and the second bits. For example, the digital output may be an 8-bit digital output including a combination of a 2-bit binary output produced in the first conversion process and a 6-bit binary output produced in the second conversion process. The 2-bit binary output may be generated by converting the first output, the second output, the third output, and/or the fourth output of the comparator 215 into the 2-bit binary output. Each of the first output, the second output, the third output, and the fourth output of the comparator 215 may be a logic "0" or "1." The second plurality of the bits of the digital output may be generated by converting the number of the clock cycles corresponding to the output of the counter into the 6-bit binary output.

While a first coarse conversion module and a second fine conversion module are shown in FIG. 2, this is merely illustrative. In some embodiments, more conversion modules may be incorporated into the ADC 200 to implement analog-to-digital conversion for crossbar-based circuits. For example, three conversion modules may be used to implement a 3-stage analog-to-digital conversion that may convert the analog input into an 8-bit digital output. The 3-stage analog-to-digital conversion may include a first coarse conversion process for generating a 2-bit output, a second coarse conversion process for generating a 2-bit output, and a third fine conversion process for generating a 4-bit output, or similar combinations.

Figure 3:
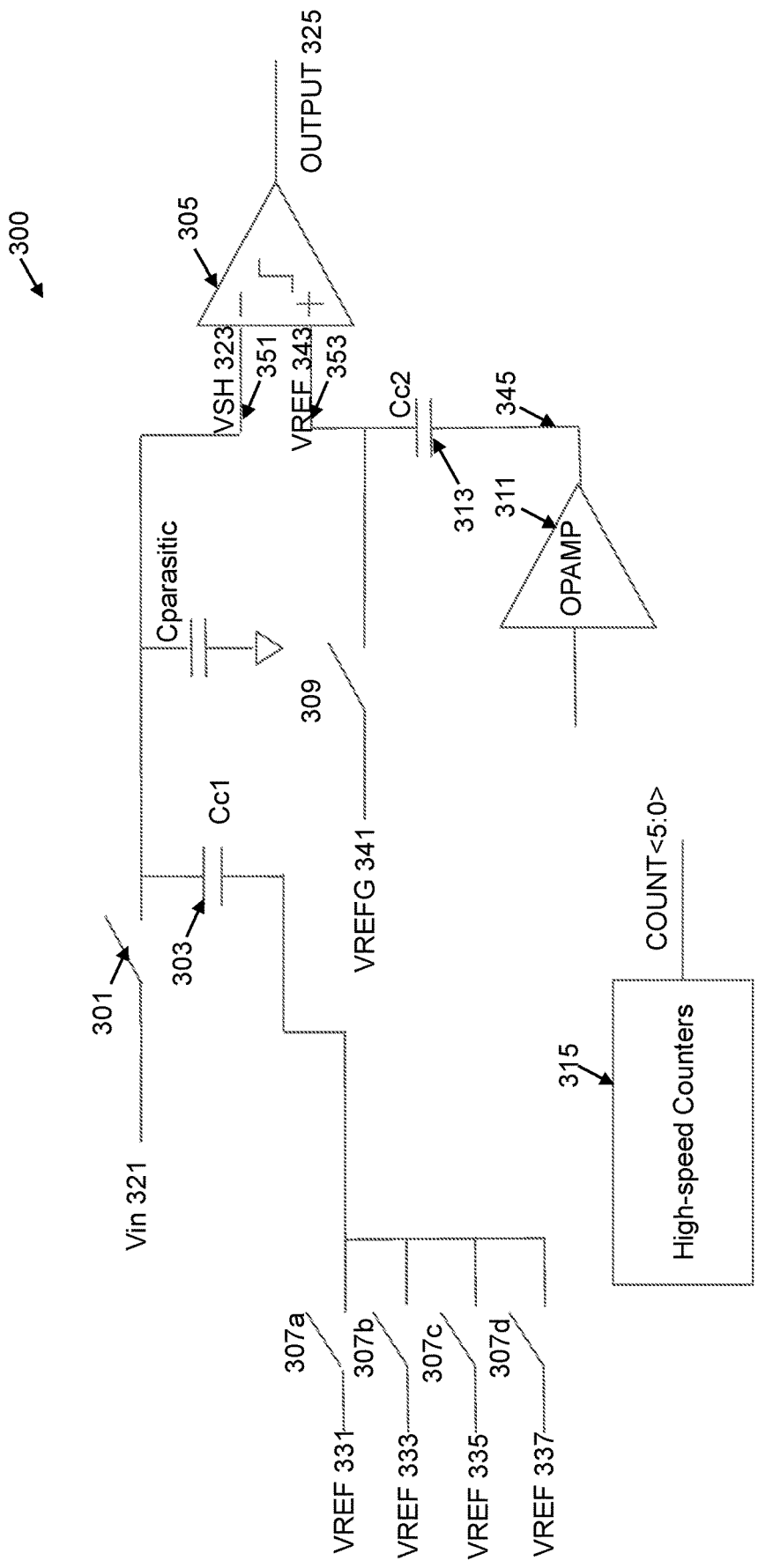
FIG. 3 is a schematic diagram illustrating an example architecture of a multistage analog-to-digital converter in accordance with some implementations of the present disclosure.

FIG. 3 is a schematic diagram illustrating an example 300 of an architecture of a multistage ADC in accordance with some embodiments of the present disclosure. As illustrated, the ADC 300 may include capacitors 303 and 313, a comparator 305, a ramp generator 311, a counter 315, and/or any other suitable component for implementing the multistage ADC. The capacitance of capacitor 303 and/or 313 may be much greater than the parasitic capacitance on nodes 351 and 353 in the ADC 300. The parasitic capacitance on nodes 351 and 353 may represent the parasitic capacitance of one or more electrical components of the crossbar circuit comprising the ADC 300 (e.g., routings, transistors, switches, etc.). The ADC 300 may further include a switch 301 for connecting an analog input voltage 321 to a first plate (e.g., the top plate) of the capacitor 303. The ADC 300 may further include switches 307a, 307b, 307c, and 307d for connecting a second plate (e.g., the bottom plate) of the capacitor 303 to reference voltages 331, 333, 335, and 337, respectively.

As shown, ADC 300 may receive the analog input voltage 321 which may correspond to an output voltage of a TIA of a crossbar circuit (e.g., TIA 141a as described in FIG. 1). The output voltage of the TIA may be produced by converting a current signal into the output voltage. The current signal may represent the summation of the current through one or more cross-point devices (e.g., a column of cross-point devices that are selected). The current signal may also be referred to herein as a channel current signal.

The ADC 300 may convert the analog input voltage 321 into a digital output that corresponds to a digital representation of the analog input voltage 321 and/or the output voltage of the TIA. For example, the ADC 300 may perform a coarse conversion process during one or more coarse conversion periods to generate a first plurality of bits of the digital output. The first plurality of bits of the digital output may include the MSBs of the digital output. The ADC 300 may further perform a fine conversion process during one or more fine conversion periods to generate a second plurality of bits of the digital output. The second bits of the digital output may include the LSBs of the digital output.

During the coarse conversion process, the first plate of the capacitor 303 may be connected to the analog input voltage 321 through the switch 301. The second plate of capacitor 303 may be selectively connected to one or more of reference voltages 331, 333, 335, and 337 during the coarse conversion process based on the output 325 of the comparator 305. The reference voltages 331, 333, 335, and 337 may represent a plurality of quantization levels corresponding to the first plurality of bits of the digital output. The reference voltage 331 may represent the full-scale analog input level of the ADC. The reference voltage 333 may represent ¾ of the full-scale analog input level. The reference voltage 335 may represent ½ of the full-scale analog input level. The reference voltage 337 may represent ¼ of the full-scale analog input level.

As an example, during a first coarse conversion period (also referred to as a "sampling phase"), the analog input voltage 321 may be sampled onto the first plate of the capacitor 303 while the second plate of capacitor 303 may be connected to the reference voltage 331 through the switch 307a. Since the capacitance of the capacitor 303 is much greater than the parasitic capacitance on node 351 in design, the sample-and-hold voltage on the node 351 may be coupled up nearly 100% by the switching of the bottom plate voltage of the capacitor 303.

The sample-and-hold voltage 323 may be provided to the comparator 305 as an input. The comparator 305 may compare the sample-and-hold voltage (VSH) 323 and a comparator reference voltage 343. During the coarse conversion process, the reference voltage 341 may be provided to the comparator 305 as the comparator reference voltage 343 via the switch 309. The amplitude of the reference voltage 341 may be a quarter of the full-scale value of the analog input voltage 321.

The comparator 305 may compare the sample-and-hold voltage 323 and the comparator reference voltage 343 and may generate a comparator output 325. The value of the comparator output 325 may indicate whether the sample-and-hold voltage 323 is greater than the comparator reference voltage 343. For example, a first value (e.g., "1") of the comparator output 325 may indicate that the sample-and-hold voltage 323 is greater than the comparator reference voltage 343. As another example, a second value (e.g., "0") of the comparator output 325 may indicate that the sample-and-hold voltage 323 is not greater than the comparator reference voltage 343. In some embodiments in which the comparator output 325 indicates that the sample-and-hold voltage 323 is not greater than the comparator reference voltage 343, the ADC may hold the value of the sample-and-hold voltage 323 (e.g., by holding the charge sampled on the capacitor 303) during the remaining coarse conversion periods. Alternatively, the sample-and-hold voltage may be further downshifted (e.g., by switching the capacitor to one or more of reference voltages 333, 335, and/or 337) in one or more subsequent coarse conversion periods until the comparator output 325 indicates that the sample-and-hold voltage 323 is not greater than the comparator reference voltage 343.

For example, a first comparator output may indicate that the sample-and-hold voltage 323 is greater than the comparator reference voltage 343. Accordingly, the sample-and-hold voltage 323 may be downshifted during a second coarse conversion period by switching the second plate of the capacitor 303 from the reference voltage 331 to the reference voltage 333. The comparator 305 may compare the downshifted sample-and-hold voltage and the comparator reference voltage 343 at the end of the second coarse conversion period. The comparator 305 may also generate a second comparator output 325 indicating whether the sample-and-hold voltage 323 is greater than the comparator reference voltage 343 at the end of the second coarse conversion period. In some embodiments in which the second comparator output indicates that the sample-and-hold voltage 323 is not greater than the comparator reference voltage 343 at the end of the second coarse conversion period, the ADC 300 may hold the value of the sample-and-hold voltage 323 (e.g., by holding the charge sampled on the capacitor 303) during the remaining coarse conversion periods.

In some embodiments in which the sample-and-hold voltage 323 is greater than the comparator reference voltage 343 at the end of the second coarse conversion period, the sample-and-hold voltage 323 may be further downshifted during a third coarse conversion period by switching the second plate of the capacitor 303 from the reference voltage 333 to the reference voltage 335. The comparator 305 may compare the sample-and-hold voltage 323 and the comparator reference voltage 343 and may generate a comparator output indicating whether the sample-and-hold voltage 323 is greater than the comparator reference voltage 343 at the end of the third coarse conversion period (also referred to as the "third comparator output").

In some embodiments in which the sample-and-hold voltage 323 is not greater than the comparator reference voltage 343 at the end of the third coarse conversion period, the ADC 300 may hold the value of the sample-and-hold voltage 323 during the remaining coarse conversion periods (e.g., the fourth coarse conversion period).

In some embodiments in which the sample-and-hold voltage 323 is greater than the comparator reference voltage 343 at the end of the third coarse conversion period, the sample-and-hold voltage 323 may be further downshifted during a fourth coarse conversion period by switching the second plate of the capacitor 303 from the reference voltage 335 to the reference voltage 337. The comparator 305 may compare the sample-and-hold voltage 323 and the comparator reference voltage 343 and may generate a comparator output indicating whether the sample-and-hold voltage 323 is greater than the comparator reference voltage 343 at the end of the fourth coarse conversion period (also referred to as the "fourth comparator output").

The ADC 300 may perform a fine conversion process after the coarse conversion process. During the fine conversion process, switch 309 may be open. The reference voltage 341 may be sampled onto the capacitor 313 with the bottom plate of the capacitor 313 connected to a ramp voltage 345 at the beginning of the fine conversion process. The ramp voltage 345 may ramp up or down over time and may be provided by the ramp generator 311. As an example, the ramp generator 311 may ramp down the ramp voltage 345 in the fine conversion process. The delta of the starting and the ending of ramp voltage 345 may be ¼ of the full-scale analog input level with the maximum clock counter counts up to $2^M$ clock cycles, where M is the number of the LSB bits. In some embodiments, the ramp generator 311 may include an op-amp driving by a DAC and/or any other suitable component for generating the ramp voltage. The comparator reference voltage 343 may be ramped down with 345 through the capacitor 313. Since the capacitance of the capacitor 313 is designed to be much greater than the parasitic capacitance on the node 353, the comparator reference voltage 343 may be downshifted, being coupled down nearly 100% by the change of the ramp voltage 345 from the beginning to the ending of the ramp when comparator 305 signal VREF 343 has crossed below VSH 323.

The comparator 305 may compare the sample-and-hold voltage 323 and the comparator reference voltage 343 while it is being ramped down in the fine conversion process. At a specific time instant, the comparison result 325 may indicate that the amplitude of the sample-and-hold voltage 323 may be the same as or greater than that of the comparator reference voltage 343 (the ramped signal). A counter 315 may be controlled by the output 325 of the comparator 305. The counter 315 may output a count corresponding to the time elapsed from the beginning of the fine conversion process (e.g., the number of the clock cycles that take the ramp voltage 345 and the sample-and-hold voltage 323 to become the same from the beginning of the fine conversion process). The count may be converted into binary bits that may be used as the second plurality of bits of the digital output of the ADC 300.

Figure 4A:
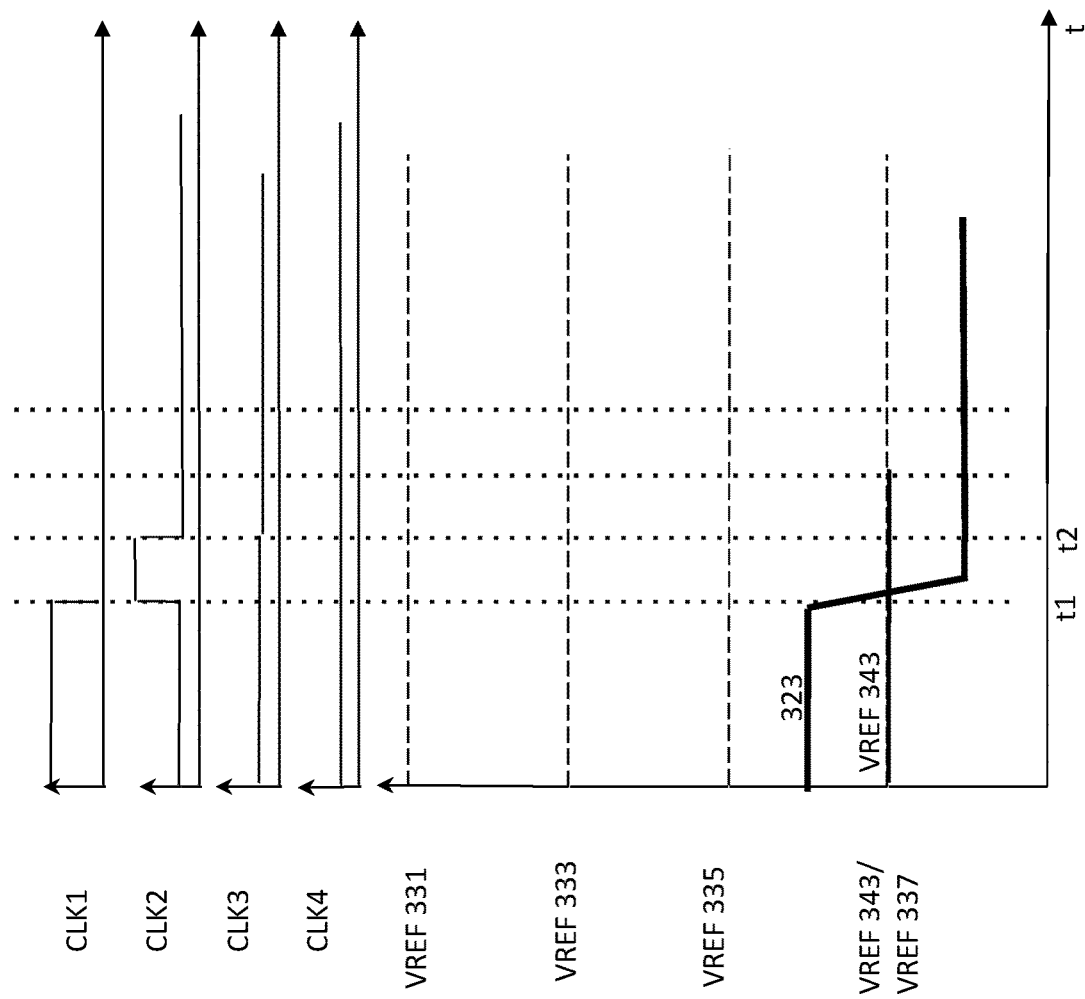
Figure 4B:
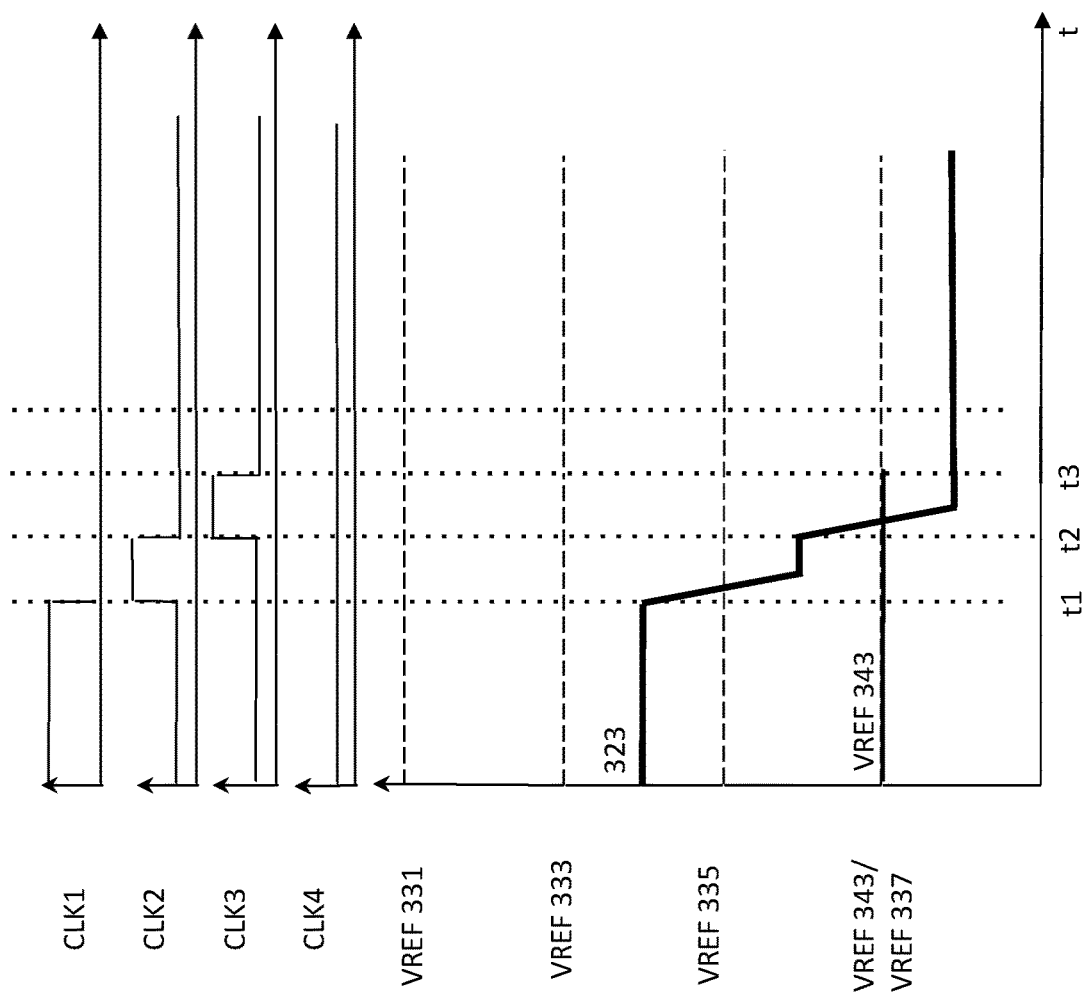

FIGS. 4A, 4B, and 4C depict example waveforms relating to a coarse analog-to-digital conversion in accordance with some embodiments of the present disclosure.

As shown in FIG. 4A, the sample-and-hold voltage 323 is greater than the comparator reference voltage 343 at time instant t1 that corresponds to the end of the first coarse conversion period. Accordingly, the sample-and-hold voltage 323 is downshifted in the second coarse conversion period. The sample-and-hold voltage 323 is not greater than the comparator reference voltage 343 at time instant t2 that corresponds to the end of the second coarse conversion period. The value of the sample-and-hold voltage 323 at t2 may be held through the remaining coarse conversion periods.

As illustrated in FIG. 4B, the sample-and-hold voltage 323 is greater than the comparator reference voltage 343 at t1 that corresponds to the end of the first coarse conversion period. Accordingly, the sample-and-hold voltage 323 is downshifted in the second coarse conversion period. The sample-and-hold voltage 323 is still greater than the comparator reference voltage 343 at t2 that corresponds to the end of the second coarse conversion period. The sample-and-hold voltage 323 is further downshifted in the third coarse conversion period. The sample-and-hold voltage 323 is not greater than the comparator reference voltage 343 at time instant t3 that corresponds to the end of the third coarse conversion period. The value of the sample-and-hold voltage 323 at t3 may be held during the remaining coarse conversion period(s) in the coarse conversion process.

As illustrated in FIG. 4C, the sample-and-hold voltage 323 is greater than the comparator reference voltage 343 at t1 that corresponds to the end of the first coarse conversion period. The sample-and-hold voltage 323 is then downshifted during the second coarse conversion period. The sample-and-hold voltage 323 is still greater than the comparator reference voltage 343 at t2 that corresponds to the end of the second coarse conversion period. The sample-and-hold voltage 323 is further downshifted during the third coarse conversion period. The sample-and-hold voltage 323 is greater than the comparator reference voltage 343 at time instant t3 that corresponds to the end of the third coarse conversion period. The sample-and-hold voltage 323 is then further downshifted during the fourth coarse conversion period. The sample-and-hold voltage 323 is not greater than the comparator reference voltage at time instant t4 that corresponds to the end of the fourth coarse conversion period.

Figure 5:
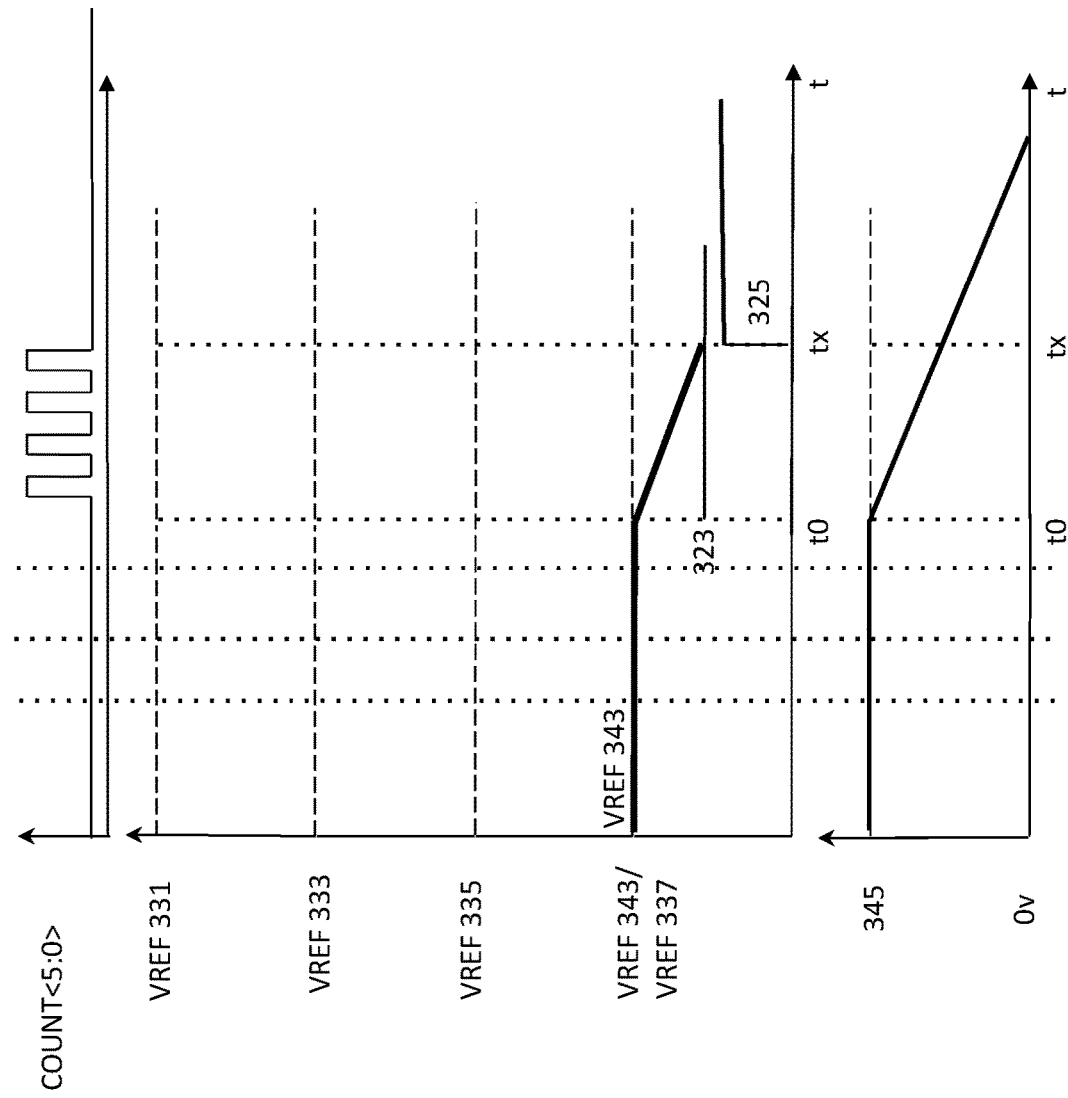
FIG. 5 depicts example waveforms relating to a fine analog-to-digital conversion process in accordance with some embodiments of the present disclosure.

FIG. 5 depicts example waveforms relating to a fine analog-to-digital conversion in accordance with some embodiments of the present disclosure. As shown, the fine conversion process may begin at a time instant to. The comparator reference voltage 343 may be ramped down with 345 through the capacitor 313 over time. The comparator output 325 may indicate that the amplitude of the sample-and-hold voltage 323 is the same as or greater than that of the comparator reference voltage 343 at time instant tx. The counter 315 may be controlled to produce an output count based on the number of clock cycles between to and tx. The number of clock cycles may be converted into a binary output (e.g., the second plurality of bits of the digital output of the ADC).

Figure 6:
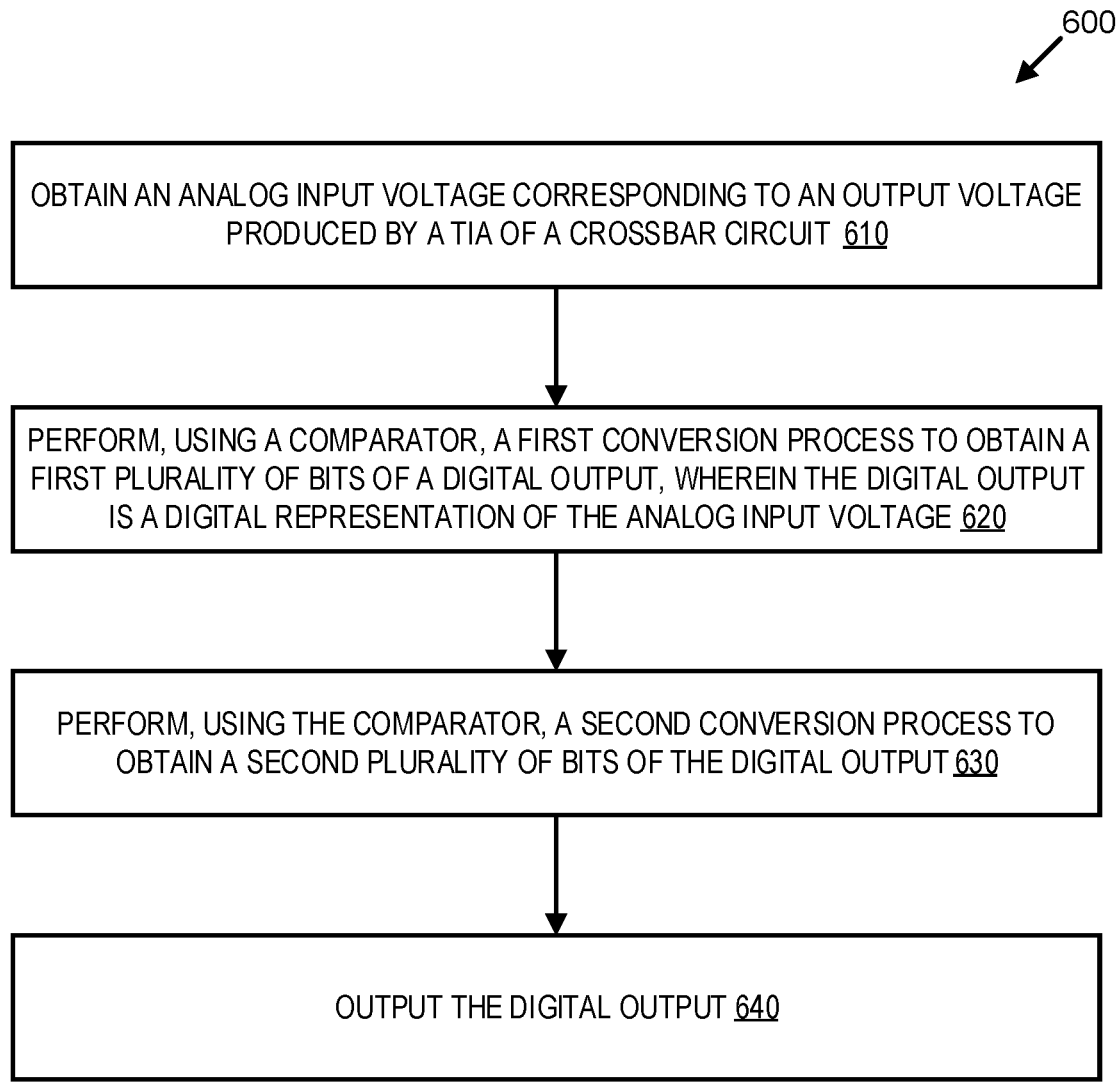
FIG. 6 is a flow diagram illustrating a method for performing analog-to-digital conversion in accordance with some embodiments of the present disclosure.

FIG. 6 is a flow diagram illustrating an example 600 of a method for performing analog to digital conversion for a crossbar-based apparatus according to some embodiments of the disclosure. Method 600 may be performed by an ADC of the crossbar-based apparatus.

At block 610, an ADC may obtain an analog input voltage. The analog input voltage may correspond to a voltage output produced by a TIA of a crossbar circuit as described herein.

At block 620, the ADC may perform, using a comparator, a first coarse conversion to obtain a first plurality of bits of a digital output. The first coarse conversion may be performed in one or more coarse conversion periods. Performing the first coarse conversion process may involve sample and hold the analog input voltage to produce a sample-and-hold voltage in a first coarse conversion period. During the first coarse conversion process, the sample-and-hold voltage may be further processed in one or more subsequent coarse conversion periods until the amplitude of the sample-and-hold voltage is lower than a comparator reference voltage applied to the comparator (e.g., by holding and/or downshifting the sample-and-hold voltage ¼ of the full-scale value of the input voltage level in the subsequent coarse conversion periods). In some embodiments, the amplitude of the comparator reference voltage may be ¼ of the full-scale level of the analog input voltage.

As an example, the comparator of the ADC may compare the sample-and-hold voltage with the comparator reference voltage at the end of each to the coarse conversion periods and may generate an output indicative of the comparison result. In some embodiments in which the output of the comparator indicates that the sample-and-hold voltage is greater than the comparator reference voltage at the end of a given coarse conversion period, the ADC may downshift the sample-and-hold voltage in a next coarse conversion period. Alternatively, in some embodiments in which the output of the comparator indicates that the sample-and-hold voltage is not greater than the reference voltage, the ADC may hold the sample-and-hold voltage unchanged through the remaining coarse conversion period(s). The ADC may further store the output of the comparator in association with its corresponding coarse conversion period.

In some embodiments, performing the first coarse conversion process may involve performing one or more operations as described in connection with FIG. 7 below.

At block 630, the ADC may perform, using the comparator, a second fine conversion process to generate a second plurality of bits of the digital output. The second plurality of bits may include the LSB of the digital output. For example, the ADC may generate, using a ramp generator, a ramp voltage that ramps down over time. In some embodiments, the ramp voltage may ramp down ¼ of the full-scale analog input level. The maximum clock count for the ramp ADC counter to ramp the entire quadrant (¼ of the full-scale input range) is $2^M$. M represents the number of the LSB digits. The comparator may compare the comparator reference voltage being ramped down and the sample-and-hold voltage produced in the first conversion process. The comparator may generate an output indicating that the sample-and-hold voltage is greater or equal to the ramped comparator reference voltage at a certain time instant.

At block 640, the ADC may output the digital output. The digital output may be a combination of the first plurality of bits and the second plurality of bits. The first plurality of bits of the digital output may be produced based the outputs of the comparator at each of the coarse conversion periods (e.g., a first output stored in association with the first coarse conversion period, a second output stored in association with the second coarse conversion period, a third output stored in association with the third coarse conversion, the fourth output stored in association with the fourth coarse conversion period, etc.). For example, the outputs of the comparator may be encoded into the first plurality of bits (e.g., by encoding the first output, the second output, the third output, and/or the fourth output of the comparator into a 2-digit output). The second plurality of bits of the digital output may be produced based on the output of the counter indicative of the number of clock cycles that has elapsed since the beginning of the fine conversion process. For example, the number of clock cycles may be converted into the second plurality of bits of the digital output.

Figure 7:
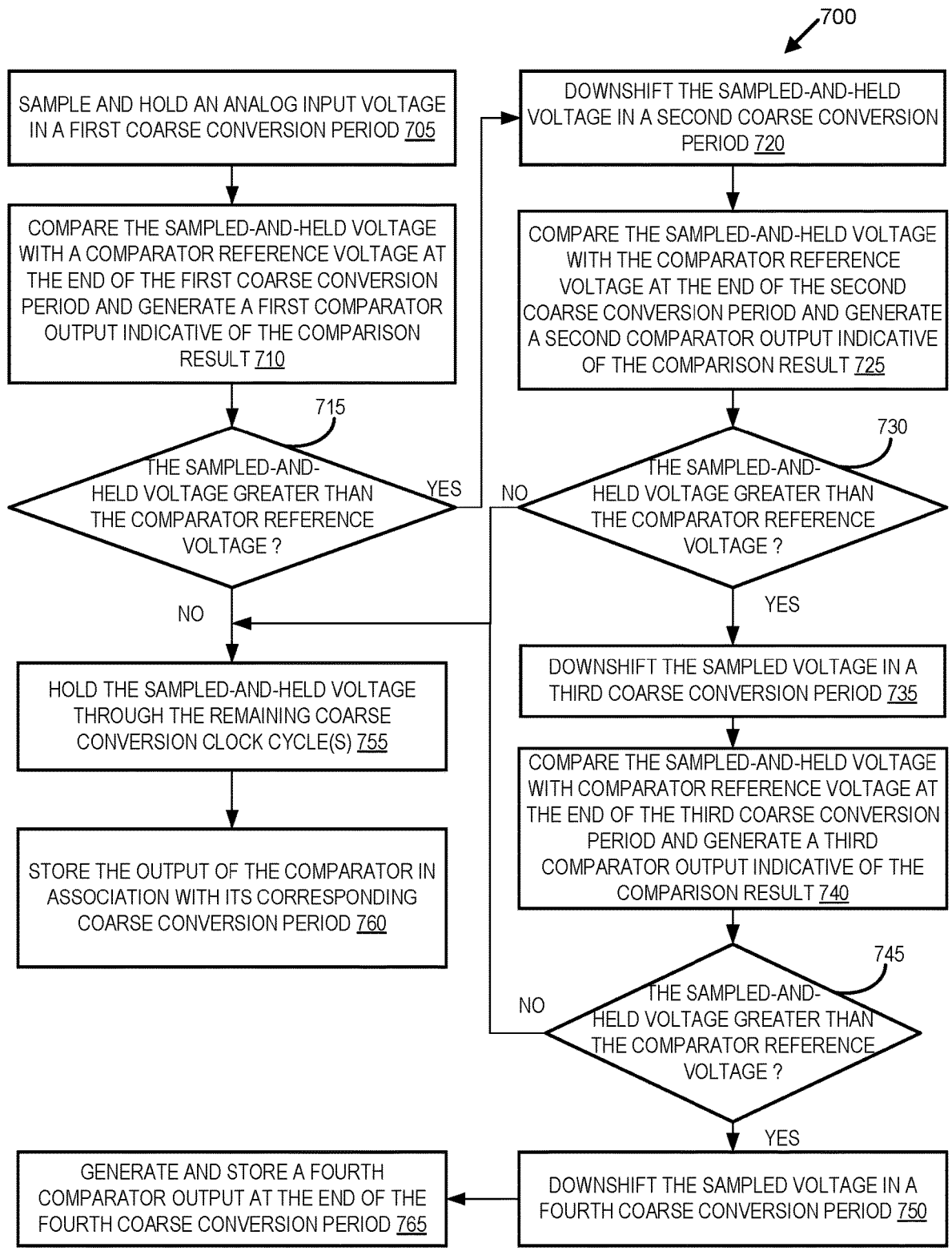
FIG. 7 is a flow diagram illustrating methods for performing a coarse analog-to-digital conversion in accordance with some embodiments of the present disclosure.

FIG. 7 is a flow diagram illustrating an example 700 of a method for performing coarse analog-to-digital conversion according to some embodiments of the disclosure.

Method 700 may start at block 705, where an ADC of a crossbar circuit may sample and hold an analog input voltage in a first coarse conversion period of a plurality of coarse conversion periods. The analog input voltage may correspond to an output voltage produced by a TIA of the crossbar circuit. As an example, the analog input voltage may be sampled and held onto a first plate (e.g., the top plate) of a first capacitor of the ADC. A second plate (e.g., the bottom plate) of the first capacitor may be connected to a first reference voltage. The first reference voltage may represent the full-scale analog input level of the ADC.

At block 710, a comparator of the ADC may compare the sample-and-hold voltage and a comparator reference voltage at the end of the first coarse conversion period and may produce a first comparator output indicative of the comparison result. The value of the first comparator output may indicate whether the sampled signal is greater than the comparator reference voltage at a first time instant corresponding to the end of the first coarse conversion period. For example, the first comparator output may have a first value (e.g., "1") in some embodiments in which the sample-and-hold voltage is greater than the comparator reference voltage at the first time instant. As another example, the first comparator output may have a second value (e.g., "0") in some embodiments in which the sample-and-hold voltage is not greater than the comparator reference voltage at the first time instant.

At block 715, a determination may be made as to whether the sample-and-hold voltage is greater than the comparator reference voltage at the end of the first coarse conversion period. The determination may be made based on the value of the first comparator output.

In view of a determination that the sample-and-hold voltage is not greater than the comparator reference voltage at the first time instant (e.g., "NO" at block 715), the ADC may hold the sample-and-hold voltage through the remaining coarse conversion periods (the second coarse conversion period, a third coarse conversion period, and a fourth coarse conversion period) at 755. The ADC may also store the first comparator output in association with the first time instant and/or the first coarse conversion period at 760.

In view of a determination that the sample-and-hold voltage is greater than the comparator reference voltage at the end of the first coarse conversion period (e.g., "YES" at block 715), the ADC may downshift the sample-and-hold voltage in a second coarse conversion period of the coarse conversion periods at 720. For example, the second plate of the first capacitor may be switched from the first reference voltage to a second reference voltage. The amplitude of the first reference voltage may be greater than the amplitude of the second reference voltage. The difference between the amplitude of the first reference voltage and that of the second reference voltage may be at least ¼ of the full-scale analog input level. As an example, the ADC may downshift the sample-and-hold voltage by ¼ of the full-scale analog input level during the second coarse conversion period.

At block 725, the ADC may compare the sample-and-hold voltage and the comparator reference voltage at the end of the second coarse conversion period and may generate a second comparator output indicative of the comparison result. The value of the second comparator output may indicate whether the sample-and-hold voltage is greater than the comparator reference voltage at a second time instant corresponding to the end of the second coarse conversion period. For example, the second comparator output may have a first value (e.g., "1") in some embodiments in which the sample-and-hold voltage is greater than the comparator reference voltage at the second time instant. As another example, the second comparator output may have a second value (e.g., "0") in some embodiments in which the sample-and-hold voltage is not greater than the comparator reference voltage at the second time instant.

At block 730, a determination may be made as to whether the sample-and-hold voltage is greater than the comparator reference voltage at the end of the second coarse conversion period. The determination may be made based on the value of the second comparator output.

In some embodiments, the ADC may proceed to 755 and may hold the sample-and-hold voltage through the remaining coarse conversion periods (e.g., the third coarse conversion period and the fourth coarse conversion period) in view of a determination that the sample-and-hold voltage is not greater than the comparator reference voltage at the second time instant ("NO" at 730). The ADC may also store the second comparator output in association with the second time instant and/or the second coarse conversion period at 760.

In some embodiments, in view of a determination that the sample-and-hold voltage is greater than the comparator reference voltage at the end of the second coarse conversion period ("YES" at block 730), the ADC may downshift the sample-and-hold voltage in a third coarse conversion period at 735. For example, the second plate of the first capacitor may be switched from the second reference voltage to a third reference voltage. The amplitude of the second reference voltage may be greater than the amplitude of the third reference voltage. The difference between the amplitude of the second reference voltage and that of the third reference voltage may be at least ¼ of the full-scale analog input level. As an example, the ADC may further downshift the sample-and-hold voltage by ¼ of the full-scale analog input level during the third coarse conversion period.

At block 740, the comparator may compare the sample-and-hold voltage and the comparator reference voltage at the end of the third coarse conversion period and may produce a third comparator output indicating the comparison result. The value of the third comparator output may indicate whether the sample-and-hold voltage is greater than the comparator reference voltage at a third time instant corresponding to the end of the third coarse conversion period. For example, the third comparator output may have a first value (e.g., "1") in some embodiments in which the sample-and-hold voltage is greater than the comparator reference voltage at the third time instant. As another example, the third comparator output may have a second value (e.g., "0") in some embodiments in which the sample-and-hold voltage is not greater than the comparator reference voltage at the third time instant.

In some embodiments, the ADC may proceed to 755 and may hold the sample-and-hold voltage through the remaining coarse conversion periods (e.g., the fourth coarse conversion period) in view of a determination that the sample-and-hold voltage is not greater than the comparator reference voltage at the third time instant ("NO" at 745). The ADC may also store the third comparator output in association with the third time instant and/or the third coarse conversion period at 760.

In some embodiments, in view of a determination that the sample-and-hold voltage is greater than the comparator reference voltage at the end of the third coarse conversion period ("YES" at block 745), the ADC may downshift the sampled voltage in a fourth coarse conversion period at 750. For example, the second plate of the first capacitor may be switched from the third reference voltage to a fourth reference voltage. The amplitude of the third reference voltage may be greater than the amplitude of the fourth reference voltage. The difference between the amplitude of the third reference voltage and that of the fourth reference voltage may be at least ¼ of the full-scale analog input level. As an example, the ADC may further downshift the sample-and-hold voltage by ¼ of the full-scale analog input level during the fourth coarse conversion period. At block 765, the ADC may generate and store a fourth output of the comparator produced at the end of the fourth coarse conversion period. The fourth output of the comparator may indicate that the sample-and-hold voltage is not greater than the comparator reference voltage at the end of the fourth coarse conversion period. The fourth output of the comparator may be stored in association with the fourth coarse conversion period and/or a fourth time instant corresponding to the end of the fourth coarse conversion period.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" may be used to mean within ±20% of a target dimension in some embodiments, within ±10% of a target dimension in some embodiments, within ±5% of a target dimension in some embodiments, and yet within ±2% in some embodiments. The terms "approximately" and "about" may include the target dimension.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. An apparatus, comprising:
 a plurality of cross-point devices with programmable conductance;
 a transimpedance amplifier (TIA) configured to produce an output voltage based on an input current, wherein the input current corresponds to a summation of current from a first plurality of the cross-point devices; and
 an analog-to-digital converter (ADC) configured to generate a digital output corresponding to a digital representation of the output voltage of the TIA, wherein to generate the digital output, the ADC is to:
  generate, using a comparator, a first plurality of bits of the digital output by performing a coarse conversion process, wherein performing the coarse conversion process comprises generating a sample-and-hold voltage based on the output voltage of the TIA; and
  generate, using the comparator, a second plurality of bits of the digital output by performing a fine conversion process on the sample-and-hold voltage.

2. The apparatus of claim 1, wherein the first plurality of bits comprises the most significant bit (MSB) of the digital output, and wherein the second plurality of bits comprises the least significant bit (LSB) of the digital output.

3. The apparatus of claim 1, wherein the plurality of cross-point devices comprises at least one of a resistive random-access memory device, a phase-change memory (PCM) device, a floating gate device, a spintronic device, a magnetic memory storage (MRAM), a static random-access memory (SRAM) device.

4. The apparatus of claim 1, wherein the plurality of cross-point devices comprises an array of cross-point devices, and wherein the first plurality of the cross-point devices corresponds to a column of the array of cross-point devices.

5. The apparatus of claim 1, wherein performing the coarse conversion process comprises:
 sampling an analog input voltage onto a first capacitor during a first coarse conversion period, wherein a bottom plate of the first capacitor is connected to a first reference voltage during the first coarse conversion period, wherein the analog input voltage corresponds to the output voltage produced by the TIA;
 comparing, using the comparator, the sampled analog input voltage with a comparator reference voltage at a first time instant corresponding to the end of the first coarse conversion period; and
 generating, using the comparator, a first comparator output based on the comparison.

6. The apparatus of claim 5, wherein, to generate the sample-and-hold voltage, the ADC is further to:
 in view of the first comparator output indicating that the sampled analog input voltage is greater than the comparator reference voltage at the first time instant, downshift the sampled analog input voltage by switching the bottom plate of the first capacitor to a second reference voltage during a second conversion period.

7. The apparatus of claim 6, wherein a difference between the first reference voltage and the second reference voltage is at least ¼ of a full-scale analog input level of the ADC.

8. The apparatus of claim 6, wherein, to generate the sample-and-hold voltage, the ADC is further to:
 in view of the first comparator output indicating that the sampled analog input voltage is not greater than the comparator reference voltage at the first time instant, hold, using the first capacitor, the sample-and-hold voltage during one or more subsequent conversion periods.

9. The apparatus of claim 5, further comprising a second capacitor configured to produce the comparator reference voltage during the fine conversion process.

10. The apparatus of claim 1, wherein, to perform the fine conversion process, the ADC is further to:
 compare, using the comparator, a ramped comparator reference voltage and the sample-and-hold voltage.

11. The apparatus of claim 10, wherein, to perform the fine conversion process, the ADC is further to:
 generate the second plurality of bits of the digital output based on an output of a counter.

12. A method, comprising:
 generating, by an analog-to-digital converter (ADC) of a crossbar circuit, a digital output corresponding to a digital representation of an output voltage of a transimpedance amplifier (TIA) of the crossbar circuit, comprising:
  generating, using a comparator, a first plurality of bits of the digital output by performing a coarse conversion process, wherein performing the coarse conversion process comprises generating a sample-and-hold voltage based on the output voltage of the TIA; and
  generating, using the comparator, a second plurality of bits of the digital output by performing a fine conversion process on the sample-and-hold voltage, wherein the output voltage is produced by the TIA based on an input current corresponding to a summation of current from a plurality of cross-point devices of the crossbar circuit.

13. The method of claim 12, wherein the first plurality of bits comprises the most significant bit (MSB) of the digital output, and wherein the second plurality of bits comprises the least significant bit (LSB) of the digital output.

14. The method of claim 12, wherein performing the coarse conversion process comprises:
 sampling an analog input voltage onto a first capacitor during a first coarse conversion period, wherein a bottom plate of the first capacitor is connected to a first reference voltage during the first coarse conversion period, wherein the analog input voltage corresponds to the output voltage produced by the TIA;
 comparing, using the comparator, the sampled analog input voltage with a comparator reference voltage at a first time instant corresponding to the end of the first coarse conversion period; and
 generating, using the comparator, a first comparator output based on the comparison.

15. The method of claim 14, wherein generating the sample-and-hold voltage comprises:
 in view of the first comparator output indicating that the sampled analog input voltage is greater than the comparator reference voltage at the first time instant, downshifting the sampled analog input voltage by switching the bottom plate of the first capacitor to a second reference voltage during a second conversion period.

16. The method of claim 15, wherein a difference between the first reference voltage and the second reference voltage is at least ¼ of a full-scale analog input level of the ADC.

17. The method of claim 14, wherein generating the sample-and-hold voltage comprises:
 in view of the first comparator output indicating that the sampled analog input voltage is not greater than the comparator reference voltage at the first time instant, holding, using the first capacitor, the sample-and-hold voltage during one or more subsequent conversion periods.

18. The method of claim 12, further comprising producing the comparator reference voltage during the fine conversion process using a second capacitor.

19. The method of claim 12, wherein performing the fine conversion process comprises:
   comparing, using the comparator, a ramped comparator reference voltage and the sample-and-hold voltage.

20. The method of claim 12, wherein performing the fine conversion process further comprises:
   generating the second plurality of bits of the digital output based on an output of a counter.

* * * * *